(12) United States Patent
Teo et al.

(10) Patent No.: US 8,389,359 B2
(45) Date of Patent: Mar. 5, 2013

(54) METHOD FOR FORMING LOW RESISTANCE AND UNIFORM METAL GATE

(75) Inventors: Lee-Wee Teo, Singapore (SG); Harry Hak-Lay Chuang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 314 days.

(21) Appl. No.: 12/701,698

(22) Filed: Feb. 8, 2010

(65) Prior Publication Data

US 2011/0195557 A1    Aug. 11, 2011

(51) Int. Cl.
*H01L 21/336* (2006.01)

(52) U.S. Cl. ........ 438/259; 438/183; 438/199; 438/233; 438/261; 438/275; 438/279; 438/591

(58) Field of Classification Search .................. 438/183, 438/199, 233, 259, 261, 275, 279, 591
See application file for complete search history.

(56) References Cited

U.S. PATENT DOCUMENTS

| | | | |
|---|---|---|---|
| 5,932,487 A | 8/1999 | Lou et al. | |
| 6,255,698 B1 * | 7/2001 | Gardner et al. | 257/369 |
| 6,365,450 B1 * | 4/2002 | Kim | 438/216 |
| 6,406,956 B1 * | 6/2002 | Tsai et al. | 438/201 |
| 7,902,058 B2 * | 3/2011 | Datta et al. | 438/592 |
| 7,977,181 B2 * | 7/2011 | Lai et al. | 438/199 |
| 8,008,143 B2 * | 8/2011 | Hsu et al. | 438/183 |
| 8,093,116 B2 * | 1/2012 | Chung et al. | 438/183 |
| 2009/0090977 A1 * | 4/2009 | Freeman et al. | 257/379 |
| 2009/0181504 A1 * | 7/2009 | Lin et al. | 438/199 |
| 2011/0057267 A1 * | 3/2011 | Chuang et al. | 257/380 |

OTHER PUBLICATIONS

Chinese Patent Office, Office Action dated Mar. 19, 2012, Application No. 201010194869.6, 7 pages.

* cited by examiner

*Primary Examiner* — Bac Au
(74) *Attorney, Agent, or Firm* — Haynes and Boone, LLP (57) ABSTRACT

The present disclosure provides a method that includes forming a high k dielectric layer on a semiconductor substrate; forming a polysilicon layer on the high k dielectric layer; patterning the high k dielectric layer and polysilicon layer to form first and second dummy gates in first and second field effect transistor (FET) regions, respectively; forming an inter-level dielectric (ILD); applying a first CMP process to the semiconductor substrate, exposing the first and second dummy gates; removing the polysilicon from the first dummy gate, resulting in a first gate trench; forming a first metal electrode in the first gate trench; applying a second CMP process; forming a mask covering the first FET region and exposing the second dummy gate; thereafter removing the polysilicon from the second dummy gate, resulting in a second gate trench; forming a second metal electrode in the second gate trench; and applying a third CMP process.

20 Claims, 7 Drawing Sheets

METHOD FOR FORMING LOW RESISTANCE AND UNIFORM METAL GATE

BACKGROUND

When a semiconductor device such as a metal-oxide-semiconductor field-effect transistor (MOSFET) is scaled down through various technology nodes, high k dielectric material and metal are adopted to form a gate stack. However, in a method to form metal gate stacks for n-type MOS (nMOS) transistors and p-type MOS (pMOS) transistors, various issues may arise when integrating the processes and materials for this purpose. For example, when a p-type metal gate of a pMOS transistor is exposed to a polysilicon removal process at a step to form an n-type metal gate, aluminum filled in the p-type metal gate is damaged and recessed. As such, an n-type metal layer may be non-uniformly deposited in the recessed p-metal gate. This causes high resistance of the p-type metal gate. Furthermore, the non-uniformity of the p-type metal gate causes device performance variation. Therefore, there is a need for a fabrication method to address the above concerns.

SUMMARY

The present disclosure provides a method for making metal gate stacks of a semiconductor device. The method includes forming a high k dielectric material layer on a semiconductor substrate; forming a polysilicon layer on the high k dielectric material layer; patterning the high k dielectric layer and the polysilicon layer to form a first dummy gate in a first field effect transistor (FET) region and a second dummy gate in a second FET region; forming an inter-level dielectric (ILD) material on the semiconductor substrate; applying a first chemical mechanical polishing (CMP) process to the semiconductor substrate, exposing the first and the second dummy gates; removing the polysilicon from the first dummy gate, resulting in a first gate trench; forming a first metal gate electrode in the first gate trench; applying a second CMP process to the semiconductor substrate; forming a mask covering the first FET region and exposing the second dummy gate; thereafter removing the polysilicon from the second dummy gate, resulting in a second gate trench; forming a second metal gate electrode in the second gate trench; and applying a third CMP process to the semiconductor substrate.

The present disclosure provides another embodiment of a method including forming a high k dielectric material layer on a semiconductor substrate; forming a polysilicon layer on the high k dielectric material layer; patterning the high k dielectric material layer and the polysilicon layer to form a first dummy gate in a p-type field-effect transistor (pFET) region, a second dummy gate in a nFET region, and a polysilicon resistor in a resistor region; forming an inter-level dielectric (ILD) material on the semiconductor substrate; removing the polysilicon layer from the first dummy gate, resulting in a first gate trench; forming a p-type metal layer in the first gate trench; forming a mask covering the pFET region and the resistor region; thereafter removing the polysilicon layer from the second dummy gate, resulting in a second gate trench; and forming a n-type metal to the second gate trench.

The present disclosure provides another embodiment of a method including forming a first dummy gate in a first type field-effect transistor (FET) region, a second dummy gate in a second type FET region, and a resistor in a resistor region; replacing the first dummy gate with a first metal gate having a first work function; forming a patterned material layer covering the first metal gate and the resistor, and exposing the second dummy gate; and thereafter replacing the second dummy gate with a second metal gate having a second work function different from the first work function.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
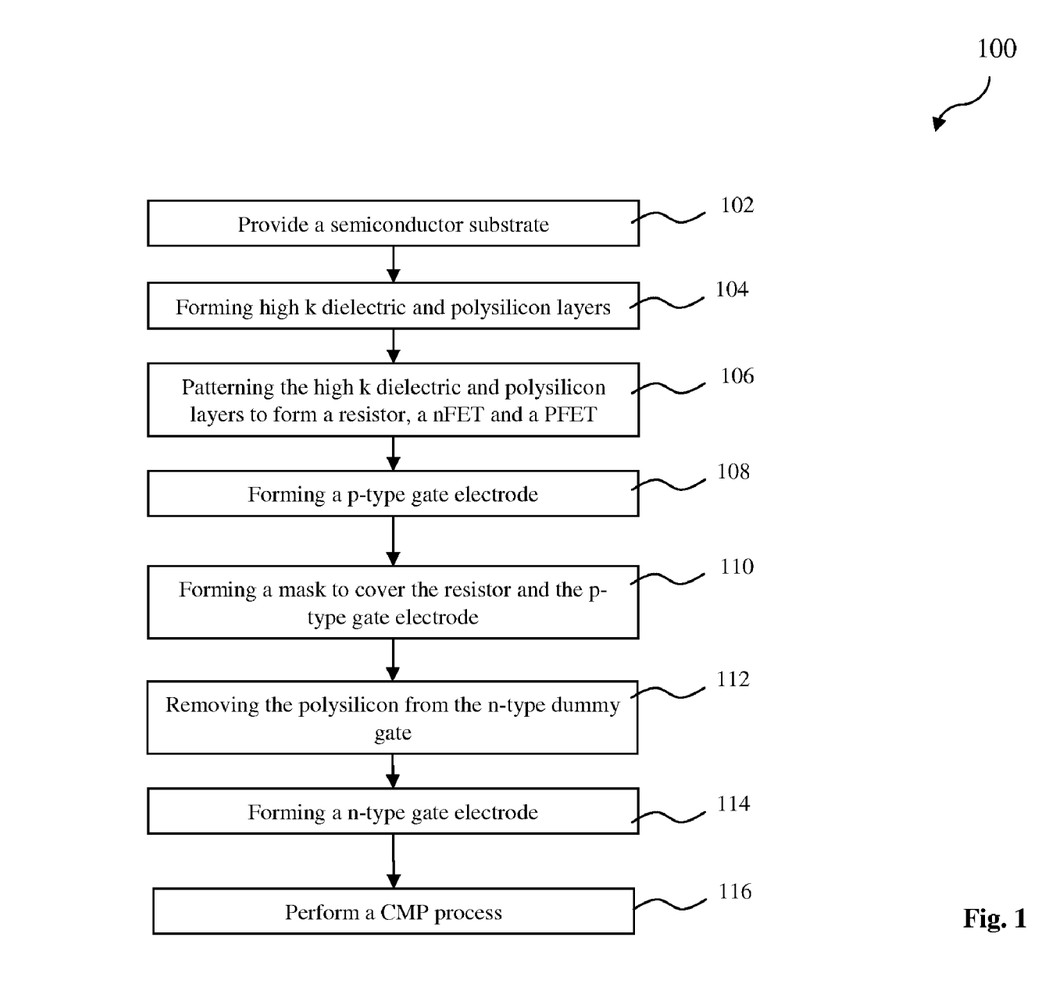
FIG. 1 is a flowchart of a method making a semiconductor device having metal gate stacks constructed according to various aspects of the present disclosure.

FIG. 1 is a flowchart of one embodiment of a method 100 making a semiconductor device having a metal gate stack constructed according to various aspects of the present disclosure. FIGS. 2 through 7 are sectional views of a semiconductor structure 200 at various fabrication stages constructed according to aspects of the present disclosure in one or more embodiments. The semiconductor structure 200 and the method 100 of making the semiconductor structure are collectively described with reference to FIGS. 1 through 7.

Figure 2:
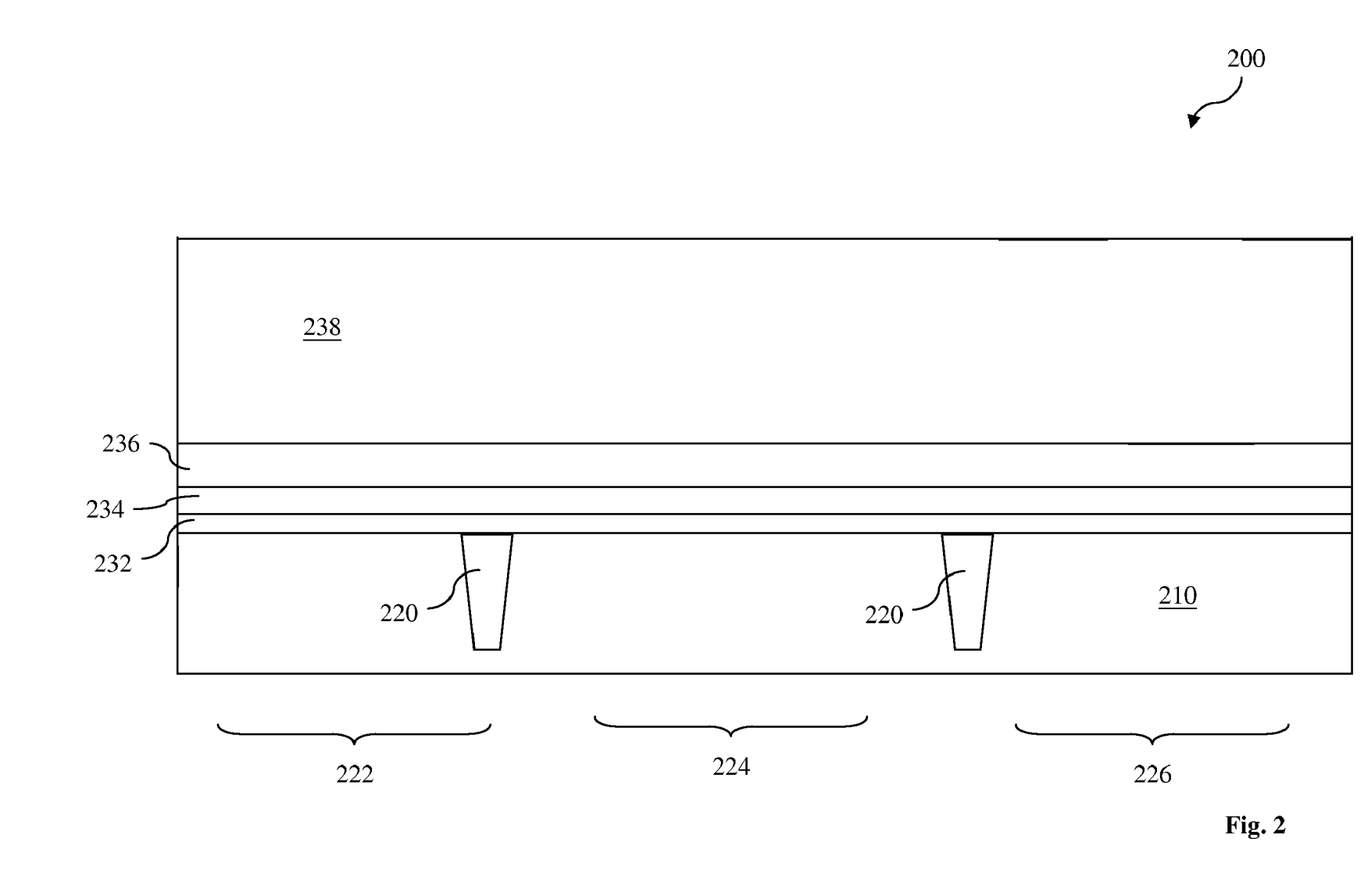
FIGS. 2 through 7 are sectional views of an embodiment of a semiconductor structure having metal gate stacks at various stages of fabrication constructed according to various aspects of the present disclosure.

Referring to FIGS. 1 and 2, the method 100 begins at step 102 by providing a semiconductor substrate 210. The semiconductor substrate 210 includes silicon. Alternatively, the substrate includes germanium, silicon germanium or other proper semiconductor materials. The semiconductor substrate 210 also includes various isolation features 220 such as shallow trench isolation formed in the substrate to separate various devices or regions. In one exemplary embodiment, the semiconductor substrate 210 includes a resistor region 222 for a resistor to be formed therein, a n-type field effect transistor (nFET) region 224 for a nFET to be formed therein, and a p-type FET (pFET) region 226 for a pFET to be formed therein. In one example, the nFET and pFET include metal-oxide-semiconductor (MOS) FETs such as a nMOSFET and a pMOSFET, respectively. The resistor includes a polysilicon resistor.

Still referring to FIGS. 1 and 2, the method 100 proceeds to step 104 by forming various material layers. In one embodiment, the various material layers include a high dielectric constant material (high k dielectric material) layer 234, and a polysilicon layer 238. The high k dielectric material layer 234 is formed by atomic layer deposition (ALD) or other suitable process. Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes hafnium oxide (HfO2). Alternatively, the high k dielectric material layer includes metal nitrides, metal silicates or other metal oxides.

In one embodiment, an interfacial layer (IL) 232 may be additionally formed on the substrate and is interposed between the semiconductor substrate 210 and the high k dielectric material layer 234. The interfacial layer includes a thin silicon oxide layer in one example. The thin silicon oxide is formed on the substrate 210 before forming the high k dielectric material layer. The thin silicon oxide layer may be formed by atomic layer deposition (ALD) or thermal oxidation.

In another embodiment, a metal layer 236 may be formed on the high k dielectric material layer 234. In one example, the metal layer 236 includes titanium nitride. The thickness of the titanium nitride metal layer is about 20 angstrom in one example. In another example, the thickness of the titanium nitride metal layer ranges between about 10 angstrom and about 30 angstrom. The titanium nitride layer in combination with the high k dielectric material layer may provide improved and enhanced device performance, such as low leakage.

Thereafter, the polysilicon layer 238 is formed on the semiconductor substrate. In one example, the polysilicon is formed by a chemical vapor deposition (CVD) or other suitable technique. In one example, silane (SiH4) can be employed as a chemical gas in the CVD process to form the polysilicon layer.

Figure 3:
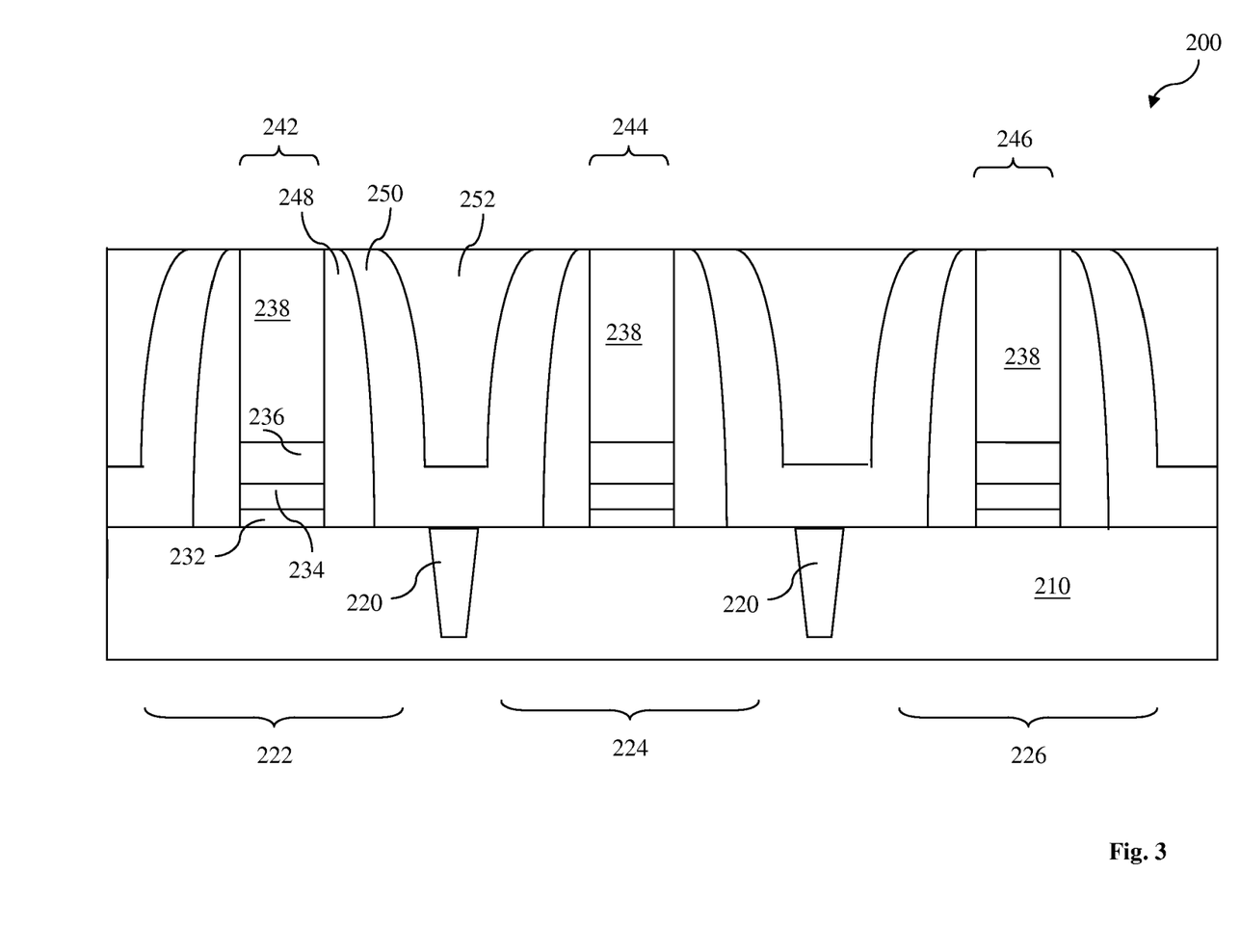

Referring to FIGS. 1 and 3, the method 100 proceeds to step 106 by patterning the various material layers to form various nFET dummy gate stacks, pFET dummy gate stacks, and additionally resistor stacks. In the present embodiment, the step 106 forms a resistor 242 in the resistor region 222, a nFET dummy gate stack 244 in the nFET region 224, and a pFET dummy gate stack 246 in the pFET region 226. At step 106, the various material layers are patterned to form the dummy gate stacks and the resistor by a process including lithography patterning and etching.

In one embodiment, a patterned photoresist layer is formed on the gate material layers, defining one or more openings of the photoresist layer. The patterned photoresist layer is formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint. In this case, the gate material layers are patterned by etching the gate layers using the patterned photoresist layer as an etching mask.

Then the various material layers are etched away within the openings of the patterned photoresist layer by an etching process. In one embodiment, the etching process utilizes a dry etching process. In one example, the dry etching process implements a fluorine-containing plasma to remove the silicon layer. In another example, the dry etching process with the fluorine-containing plasma is implemented to remove the silicon layer, the metal layer and the high k dielectric material layer. In furtherance of the example, the etch gas includes CF4. Alternatively, the etching process may include multiple etching steps to etch the various gate material layers.

In another embodiment, a hard mask is formed on the gate layers. The hard mask layer includes one or more dielectric materials and is formed by a suitable process, such as CVD. In various embodiments, the hard mask layer includes silicon oxide, silicon nitride, silicon oxynitride or a combination thereof in a multi-film structure. A patterned photoresist layer is formed on the hard mask layer. Then the hard mask layer is etched away within the openings of the patterned photoresist layer, resulting in a patterned hard mask layer. The etching process applied to the hard mask layer can be a wet etching process or a dry etching process. For example, a hydrofluoric (HF) solution may be used to etch a silicon oxide hard mask layer.

Additionally or alternatively, LDD features are formed in the nFET region and pFET region by various ion implantation processes such that the LDD regions are aligned with the dummy gate stacks. The gate spacers 248 are formed afterward by dielectric deposition and dry etching process. Then heavily doped source and drain regions are formed by various ion implantation processes.

Then an etch stop layer (ESL) 250 may be formed on the substrate 210. In one example, silicon nitride is formed as the ESL by CVD or other suitable method. An inter-level dielectric (ILD) layer 252 is formed on the semiconductor substrate and the dummy gate stacks using a suitable process, such as CVD or spin-on glass (SOG). The ILD includes a dielectric material, such as silicon oxide, low k dielectric material or other suitable dielectric material. For example, the ILD layer is formed by a high density plasma CVD. The ILD layer is disposed on the substrate between and on the multiples gate stacks and the resistor.

Then a chemical mechanical polishing (CMP) process is applied to the semiconductor substrate 210 to polish the substrate such that the polysilicon 238 is exposed. In another embodiment, a hard mask may be formed on the polysilicon and used to form the dummy gate stacks. In this case, the CMP process is applied to expose the hard mask and then an etching process such as a wet etch dip is applied to remove the hard mask, resulting an exposed polysilicon.

Figure 4:
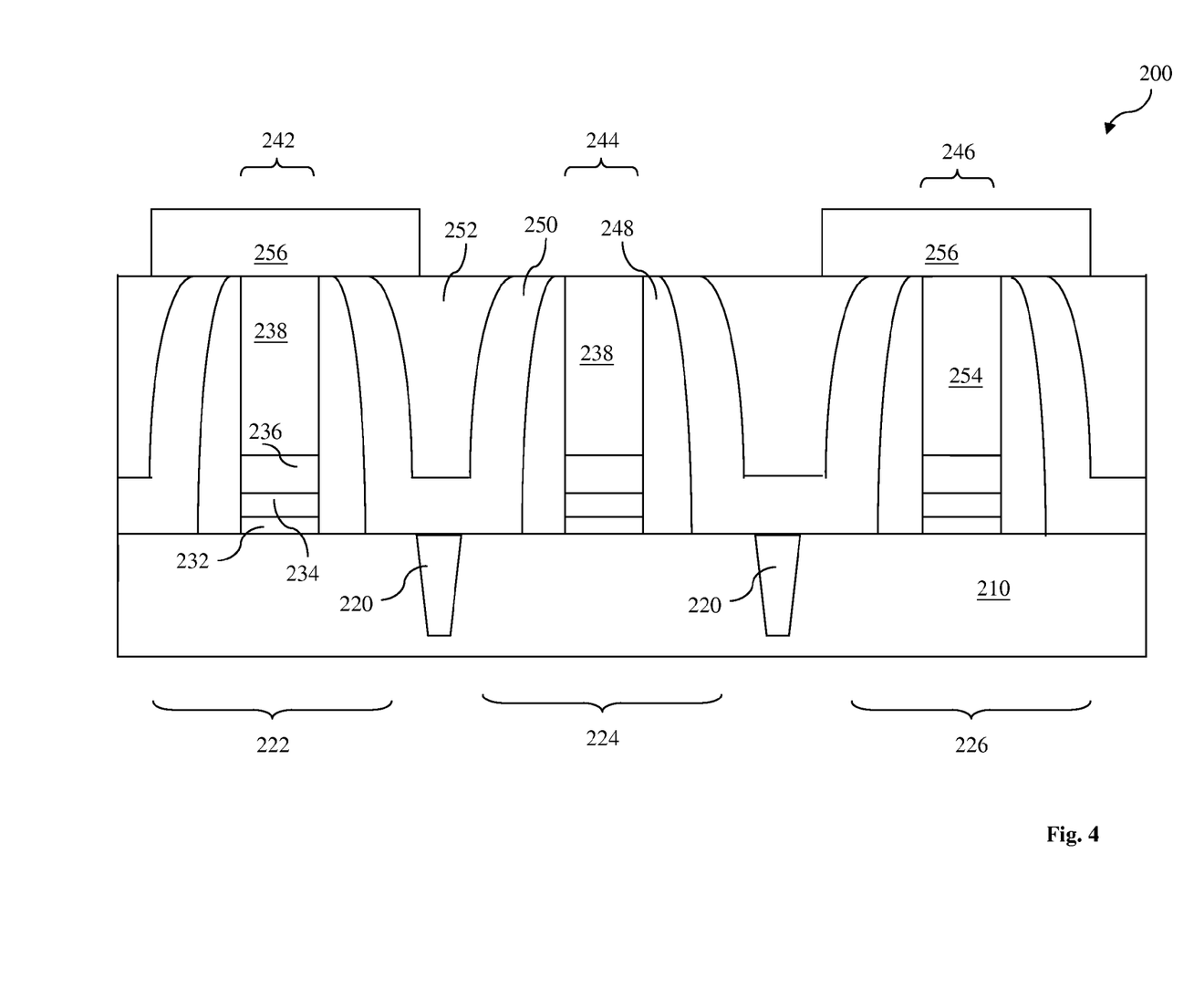

Referring to FIGS. 1 and 4, the method 100 proceeds to next step 108 by forming a p-type gate electrode 254 in the pFET region 226. The p-type gate electrode 254 includes a metal layer and may has a multi-layer structure with multi metal materials. First, the gate trench is formed by removing the polysilicon in the p-type dummy gate 246 using a process including lithography patterning and etching. In one embodiment, a patterned photoresist layer is formed on the substrate covering the resistor 242 and the n-type dummy gate 244, and having an opening to expose the p-type dummy gate 246. Then the polysilicon in the p-type dummy gate 246 is removed by an etching process. For example, a potassium hydroxide (KOH) solution may be used to remove the polysilicon in the p-type dummy gate. In another embodiment, the etching process includes multiple etching steps tuned to remove the polysilicon and any other material layers intended to be removed, resulting in a gate trench in the pFET region 226, the gate trench being also referred to as a p gate trench. After the removal of the polysilicon layer in the pFET dummy gate, the patterned photoresist layer is stripped by a wet chemical or ashed by oxygen plasma.

The p gate trench in the pFET region 226 is filled with one or more metal materials by a suitable technique, such as PVD, CVD and/or plating. In one example, a metal layer is deposited in the p gate trench for the proper work function to the pFET. The metal layer is also referred to as p metal or p-type metal. An additional conductive material, such as aluminum, is then filled in the gate trench. A CMP process is then applied to remove the metal materials on the ILD layer, to remove the excessive metal material within the pFET region 226, and to planarize the substrate surface for subsequent processing steps. In one embodiment, the p metal has a work function equaling to or being greater than about 5.2 eV. For example, the p metal includes titanium nitride. In another embodiment, the conductive material filled in the p gate trench may alternatively include other suitable metal or alloy. For example, the conductive material layer may alternatively include tungsten.

Still referring to FIGS. 1 and 4, the method 100 proceeds to next step 110 by forming a mask 256 patterned to cover the p-type gate electrode 254 in the pFET region 226 and the resistor 242 in the resistor region 222, and have an opening to expose the polysilicon 238 of the n-type dummy gate 244 in the nFET region 224. In one embodiment, the mask 256 includes titanium nitride (TiN) formed by a PVD or other suitable process. In another embodiment, the TiN mask includes a thickness ranging between about 2 nm and about 20 nm. More specifically, the TiN mask includes a thickness ranging between about 2 nm and about 10 nm. Alternatively, the mask 256 may include other suitable material, such as tantalum nitride (TaN), silicon oxide (SiO2), silicon nitride (SiN), silicon carbide (SiC), photoresist, or combination thereof. In one embodiment, the mask 256 is patterned to expose the n-type dummy gate 244 by a process including lithography patterning and etching. In one example, a photoresist layer is first formed on the mask 256 and is then patterned by a lithography process. Then the openings defined in the photoresist layer is transferred to the mask 256 by an etching process, such as dry etch, wet etch, or a combination thereof. Alternatively, the mask 256 is a patterned photoresist layer formed by a lithography process including coating, baking, exposing, post-exposure baking (PEB) and developing.

Figure 5:
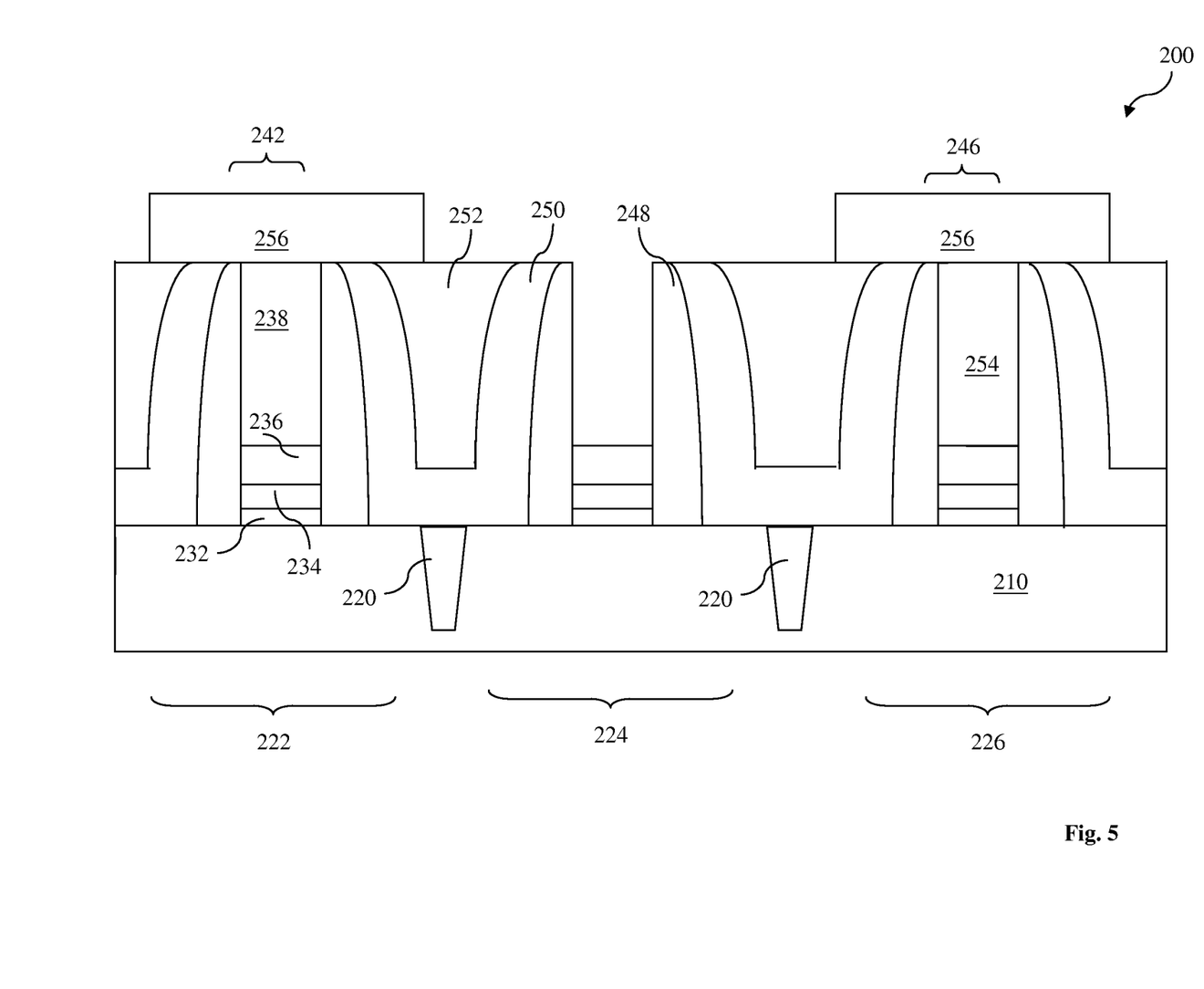

Referring to FIGS. 1 and 5, the method 100 proceeds to next step 112 by applying an etching process to remove the polysilicon 238 from the n-type dummy gate 244 in the nFET region 224. The etching process may include dry etching, wet etching or combinations thereof. For example, a potassium hydroxide (KOH) solution may be used to remove the polysilicon in the n-type dummy gate. In another embodiment, the etching process includes multiple etching steps tuned to remove the polysilicon or other material layers intended to be removed, forming a gate trench in the nFET region 224, also referred to n gate trench.

Figure 6:
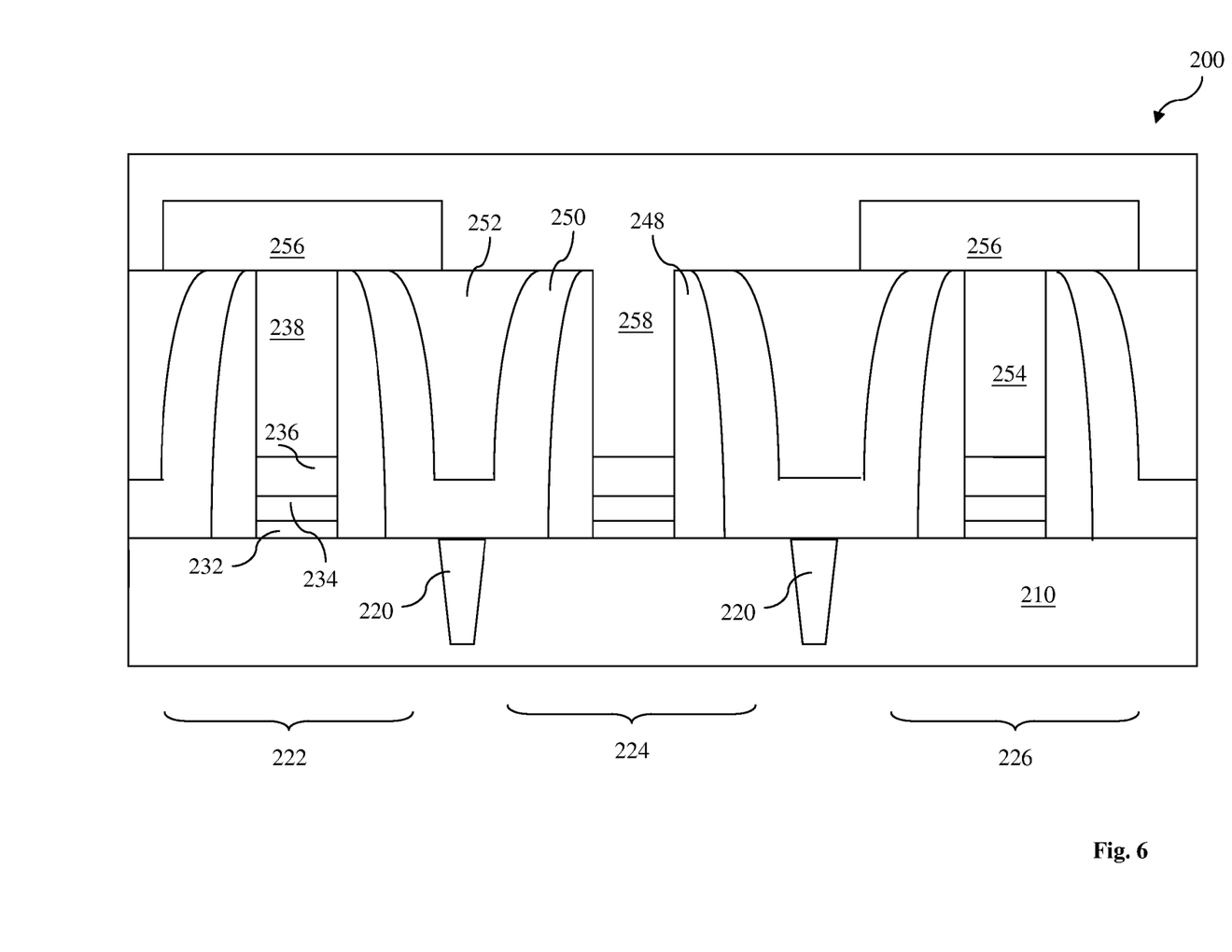

Referring to FIGS. 1 and 6, the method 100 proceeds to next step 114 by forming a n-type gate electrode in the n gate trench in the nFET region 224. The n-type gate electrode includes a metal layer and may has a multi-layer structure with multiple metal materials. The n-type gate electrode is formed by filling the n gate trench in the nFET region 224 with one or more metal materials 258 by a suitable technique, such as PVD, CVD, plating, or combinations thereof. In one example, deposited in the n gate trench is a metal layer having a proper work function to the nFET for enhanced device performance. The metal layer is also referred to as n metal or n-type metal. An additional conductive material, such as aluminum, is then filled in the gate trench. In one embodiment, the n metal has a work function that equals to or is less than about 4.2 eV. For example, the n metal includes tantalum. In another embodiment, the conductive material filled in the n gate trench may alternatively include other suitable metal or alloy. For example, the conductive material layer may alternatively include tungsten.

Figure 7:
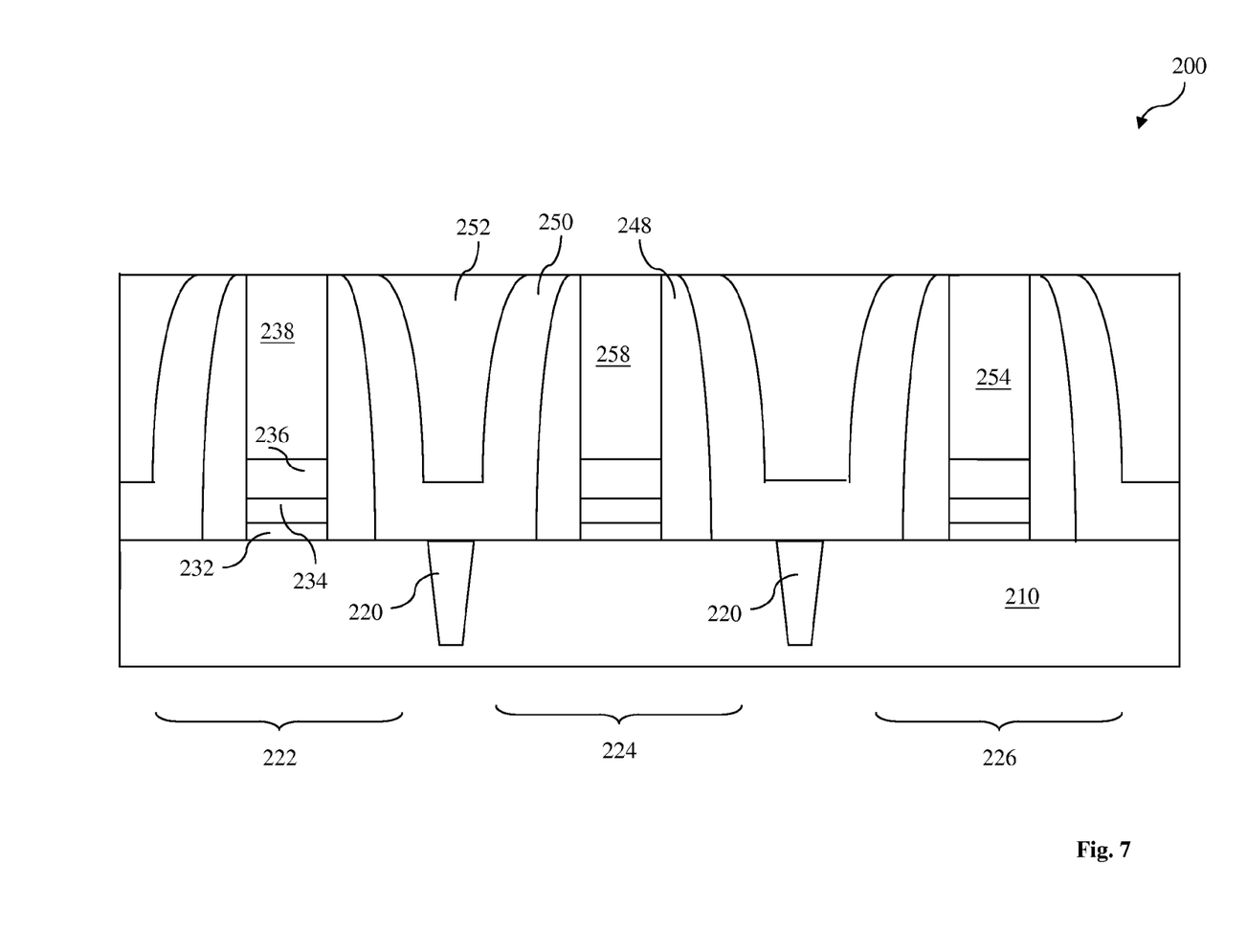

Referring to FIGS. 1 and 7, the method 100 proceeds to next step 116 by performing a CMP process to remove the excessive metal material, and planarize the substrate surface for subsequent processing steps. The mask 256 may be removed in the CMP process as well. Alternatively, the mask layer may be removed separately by another etching process.

In another embodiment where the patterned photoresist layer is used as the mask 256 to cover the resistor 242 and the p gate electrode 254, the patterned photoresist layer may be stripped by a wet chemical or ashed by oxygen plasma after removal of the polysilicon layer in the nFET dummy gate and before filling the n gate trench with metal.

By implementing the disclosed method 100 in various embodiments, some of advantages described below may present. However, it is understood that different embodiments disclosed herein offer different advantages and that no particular advantage is necessarily required in all embodiments. As one example, after forming a mask to cover the p metal gate electrode in the pFET region, the polysilicon layer is thereafter removed from the dummy gate in the nFET region, and a n metal layer and a conductive layer (such as aluminum) are formed in the gate trench of the nFET region. The p metal gate electrode is not damaged, etched, and recessed. The n meta layer is avoided to be filled in the pFET region. The p metal gate electrode maintains its integrity and its expected work function. In another example, the resistance of the pFET metal gate electrode is not negatively increased. This can reduce RC delay and improve the circuit performance. In another example, p metal gate electrode gap filling is improved. In other examples, the resistance uniformity of the p metal gate electrodes is improved and the pFET mismatch is reduced as well. In another example, the disclosed process has cost advantages since no additional photomask is employed. For other embodiments with resistors formed in the same processing flow to form the nFETs and pFETs, the mask is patterned to cover the resistor as well so the resistor maintains its integrity. No n-metal or p metal layer is formed in the resistor so its resistance is maintained unchanged. For instance, the resistance of the resistor is substantially determined by the polysilicon layer. In another embodiment, the resistance of the resistor is determined by both the polysilicon layer and the titanium nitride layer underlying the polysilicon if present.

In another embodiment, the p metal gate electrode and n metal gate electrode are formed in a different sequence. In this situation, the n metal gate electrode is first formed by removing the polysilicon layer, depositing the n metal layer, filling aluminum, and then applying a CMP process to planarize the substrate and remove the n metal and aluminum above the n metal gate electrode. Then a mask (a hard mask or photoresist layer) is patterned to cover the n metal gate electrode (and may additionally cover the resistor if present) and expose the pFET dummy gate in the pFET region. Thereafter, the polysilicon layer is removed from the pFET dummy gate in the pFET region. The p metal gate electrode is then formed by a process including depositing the p metal layer, filling aluminum, and then applying a CMP process to planarize the substrate and remove the p metal and aluminum above the p metal gate electrode.

By the disclosed methods and the structures made thereby in various embodiments, the metal gate stacks for nFETs and pFETs are formed with different compositions and configurations. The work functions for nFET and pFET regions are tuned independently. Furthermore, the resistor of polysilicon is free from those tuning and maintained its resistance and device integrity. In various embodiments, the performances of the nFETs, pFETs and resistors are optimized and enhanced. The issues associated with previous metal gate formation are eliminated or reduced.

The present method and the semiconductor structure include various alternatives. For example, the high k dielectric material layer can be formed by a suitable process such as an atomic layer deposition (ALD). Other methods to form the high k dielectric material layer include metal organic chemical vapor deposition (MOCVD), physical vapor deposition (PVD), and molecular beam epitaxy (MBE). In one embodiment, the high k dielectric material includes HfO2. In another embodiment, the high k dielectric material includes Al2O3. Alternatively, the high k dielectric material layer includes metal nitrides, metal silicates or other metal oxides. The interfacial layer interposed between the semiconductor substrate and the high k dielectric layer can be silicon oxide and may be formed by various suitable methods such as thermal oxidation, ALD or UV-Ozone Oxidation. The interfacial silicon oxide layer may have a thickness less than 10 A. In another example, the silicon oxide layer has a thickness of about 5 angstrom.

The various metal gate layer can be formed by PVD or other suitable process. The disclosed semiconductor structures may include an additional capping layer interposed between the high k dielectric material layer and the metal gate layer(s). The capping layer includes lanthanum oxide (LaO) in one example. The capping layer may alternatively includes other suitable material. The capping layer may be formed over the high k dielectric layer before the polysilicon layer is disposed.

The various patterning process may include forming a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint.

In another embodiment, the various patterning process may include forming an additional or alternative patterned hard mask layer. In one example, the patterned hard mask layer includes silicon nitride. As one example of forming the patterned silicon nitride hard mask, a silicon nitride layer is deposited on the polysilicon layer by a low pressure chemical vapor deposition (LPCVD) process. The precursor including dichlorosilane (DCS or SiH2Cl2), bis(TertiaryButylAmino) silane (BTBAS or C8H22N2Si) and disilane (DS or Si2H6) is used in the CVD process to form the silicon nitride layer. The silicon nitride layer is further patterned using a photolithography process to form a patterned photoresist layer and an etching process to etch the silicon nitride within the openings of the patterned photoresist layer. Other dielectric material may be used as the patterned hard mask. For example, silicon oxynitride may be used as a hard mask.

Although not shown, other processing step may present to form various doped regions such as source and drain regions. In one example, the light doped drain (LDD) regions are formed after the formation of the dummy gate stack. A gate spacer may be formed on the sidewalls of the metal gate stack. Then the source and drain regions are formed substantially aligned with the outer edges of the spacers. The gate spacers may have a multilayer structure and may include silicon oxide, silicon nitride, silicon oxynitride, or other dielectric material. The doped source and drain regions and LDD regions of either an n-type dopant or a p-type dopant are formed by a conventional doping process such as ion implantation. N-type dopant impurities employed to form the associated doped regions may include phosphorus, arsenic, and/or other materials. P-type dopant impurities may include boron, indium, and/or other materials. The polysilicon layer in the resistor may be separately doped or in-situ doped for tuned resistance according to the design specification.

Other features, such as multilayer interconnection (MLI), may be further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The isolation features may include different structures and can be formed using different processing technologies. For example, an isolation feature may include shallow trench isolation (STI) features. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The semiconductor structures in various embodiments and the methods of making the same may be used in other semiconductor devices having a high k and metal gate features, such as strained semiconductor substrate or a hetero-semiconductor device. For example, a strained semiconductor structure may include silicon germanium (SiGe) in the pFET region to enhance the carrier mobility in the channel of the pFET transistor. In another example, the strained semiconductor structure may include silicon carbide (SiC) in the nFET region to enhance the carrier mobility in the channel of the nFET transistor.

The present disclosure is not limited to applications in which the semiconductor structure includes a MOS transistor, and may be extended to other integrated circuit having a metal gate stack. For example, the semiconductor structures may include a dynamic random access memory (DRAM) cell, a single electron transistor (SET), and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

In another embodiment, the semiconductor substrate may include an epitaxial layer. For example, the substrate may have an epitaxial layer overlying a bulk semiconductor. Further, the substrate may be strained for performance enhancement. For example, the epitaxial layer may include a semiconductor material different from those of the bulk semiconductor such as a layer of silicon germanium overlying a bulk silicon, or a layer of silicon overlying a bulk silicon germanium formed by a process including SEG. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

Thus, the present disclosure provides a method for making metal gate stacks of a semiconductor device. The method includes forming a high k dielectric material layer on a semiconductor substrate; forming a polysilicon layer on the high k dielectric material layer; patterning the high k dielectric layer and the polysilicon layer to form a first dummy gate in a first field effect transistor region and a second dummy gate in a second FET region; forming an inter-level dielectric (ILD) material on the semiconductor substrate; applying a first chemical mechanical polishing (CMP) process to the semiconductor substrate, exposing the first and the second dummy gates; removing the polysilicon from the first dummy gate, resulting in a first gate trench; forming a first metal gate electrode in the first gate trench; applying a second CMP process to the semiconductor substrate; forming a mask covering the first FET region and exposing the second dummy gate; thereafter removing the polysilicon from the second dummy gate, resulting in a second gate trench; forming a second metal gate electrode in the second gate trench; and applying a third CMP process to the semiconductor substrate.

The present disclosure provides another embodiment of a method including forming a high k dielectric material layer on a semiconductor substrate; forming a polysilicon layer on the high k dielectric material layer; patterning the high k dielectric material layer and the polysilicon layer to form a first dummy gate in a p-type field-effect transistor (pFET) region, a second dummy gate in a nFET region, and a polysilicon resistor in a resistor region; forming an inter-level dielectric (ILD) material on the semiconductor substrate; removing the polysilicon layer from the first dummy gate, resulting in a first gate trench; forming a p-type metal layer in the first gate trench; forming a mask covering the pFET region and the resistor region; thereafter removing the polysilicon layer from the second dummy gate, resulting in a second gate trench; and forming a n-type metal to the second gate trench.

The present disclosure provides another embodiment of a method including forming a first dummy gate in a first type field-effect transistor (FET) region, a second dummy gate in a second type FET region, and a resistor in a resistor region; replacing the first dummy gate with a first metal gate having a first work function; forming a patterned material layer covering the first metal gate and the resistor, and exposing the second dummy gate; and thereafter replacing the second dummy gate with a second metal gate having a second work function different from the first work function.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for making metal gate stacks of a semiconductor device comprising:
    forming a high k dielectric layer on a semiconductor substrate;
    forming a polysilicon layer on the high k dielectric layer;
    patterning the high k dielectric layer and the polysilicon layer to form a first dummy gate in a first field effect transistor (FET) region and a second dummy gate in a second FET region;
    after patterning the high k dielectric layer and the polysilicon layer, forming an inter-level dielectric (ILD) layer on the semiconductor substrate;
    applying a first chemical mechanical polishing (CMP) process to the semiconductor substrate, such that a portion of the ILD layer is removed thereby exposing the first and the second dummy gates;
    after applying the first CMP process, removing the polysilicon layer from the first dummy gate, resulting in a first gate trench;
    forming a first metal gate electrode over the high k dielectric layer in the first gate trench;
    after forming the first metal gate electrode, applying a second CMP process to the semiconductor substrate;
    after applying the second CMP process, forming a mask covering the first metal gate electrode and exposing the second dummy gate;
    after forming the mask, removing the polysilicon layer from the second dummy gate, resulting in a second gate trench;
    forming a second metal gate electrode over the high k dielectric layer in the second gate trench; and
    after forming the second metal gate electrode, applying a third CMP process to the semiconductor substrate;
    wherein the step of forming a mask includes forming a titanium nitride (TiN) layer.

2. The method of claim 1, wherein the first metal gate electrode includes a first metal layer having a first work function, and the second metal gate electrode includes a second metal layer having a second work function different from the first work function.

3. The method of claim 2, wherein the first work function equals or is greater than about 5.2 eV, and the second work function equals or is less than about 4.2 eV.

4. The method of claim 2, wherein the first metal gate electrode further includes a third metal layer disposed on the first metal layer and the second metal gate electrode further includes the third metal layer disposed on the second metal layer.

5. The method of claim 4, wherein the third metal layer includes aluminum.

6. The method of claim 2, wherein the first metal layer includes a titanium nitride layer.

7. The method of claim 2, wherein the second metal layer includes a tantalum layer.

8. The method of claim 1, wherein the first FET region includes a p-type FET having the first metal gate electrode and the second FET region includes a n-type FET having the second metal gate electrode.

9. The method of claim 1, wherein the first FET region includes a n-type FET having the first metal gate electrode and the second FET region includes a p-type FET having the second metal gate electrode.

10. The method of claim 1, wherein the step of patterning the high k dielectric layer and the polysilicon layer includes patterning the high k dielectric layer and the polysilicon layer to additionally form a polysilicon resistor in a resistor region.

11. The method of claim 1, wherein the step of forming a mask includes forming the mask having a thickness ranging between about 2 nm and about 20 nm.

12. The method of claim 1, further comprising forming a metal layer on the high k dielectric layer,
   wherein patterning the high k dielectric layer and the polysilicon layer to form a first dummy gate in a first field effect transistor (FET) region and a second dummy gate in a second FET region includes patterning the metal layer to form the first dummy gate in the first field effect transistor (FET) region and the second dummy gate in a second FET region, and
   wherein forming the second metal gate electrode over the high k dielectric layer in the second gate trench includes forming the second metal gate electrode over the metal layer in the second gate trench.

13. A method, comprising:
   forming a high k dielectric material layer on a semiconductor substrate;
   forming a polysilicon layer on the high k dielectric material layer;
   patterning the high k dielectric material layer and the polysilicon layer to form a first dummy gate in a p-type field-effect transistor (pFET) region, a second dummy gate in a nFET region, and a polysilicon resistor in a resistor region;
   forming an inter-level dielectric (ILD) material on the semiconductor substrate;
   removing the polysilicon layer from the first dummy gate, resulting in a first gate trench;
   forming a p-type metal layer in the first gate trench;
   forming a mask covering the p-type metal layer and the polysilicon resistor;
   thereafter removing the polysilicon layer from the second dummy gate, resulting in a second gate trench; and
   forming a n-type metal layer in the second gate trench, wherein the mask covers the p-type metal layer and the polysilicon resistor during the forming the n-type metal layer in the second gate trench.

14. The method of claim 13, wherein the step of forming a mask includes forming a titanium nitride layer using a physical vapor deposition.

15. The method of claim 14, wherein the step of forming the titanium nitride includes forming the titanium nitride having a thickness ranging between about 2 nm and about 10 nm.

16. The method of claim 15, wherein the step of forming a mask includes forming a material layer of a material selected from the group consisting of titanium nitride, tantalum nitride, silicon oxide, silicon nitride, silicon carbide, and photoresist, and combinations thereof.

17. A method, comprising:
   forming a first dummy gate in a first type field-effect transistor (FET) region, a second dummy gate in a second type FET region, and a resistor in a resistor region;
   replacing the first dummy gate with a first metal gate having a first work function;
   forming a patterned material layer covering the first metal gate and the resistor and exposing the second dummy gate; and
   replacing the second dummy gate with a second metal gate having a second work function different from the first work function, wherein the patterned material layer remains covering the first metal gate and the resistor during the replacing the second dummy gate.

18. The method of claim 17, wherein the step of forming the first dummy gate, the second dummy gate and the resistor includes
   forming a high k dielectric material layer;
   forming a polysilicon layer on the high k dielectric material layer; and
   patterning the high k dielectric material layer and the polysilicon layer to form the first dummy gate, the second dummy gate, and the resistor.

19. The method of claim 17, wherein the step of forming a patterned material layer includes forming a patterned material layer of a material selected from the group consisting of titanium nitride, tantalum nitride, silicon oxide, silicon nitride, silicon carbide, and photoresist, and combinations thereof.

20. The method of claim 17, wherein the patterned material layer includes titanium nitride.

* * * * *